United States Patent
Kao et al.

(10) Patent No.: US 9,812,482 B2
(45) Date of Patent: Nov. 7, 2017

(54) FRONTSIDE ILLUMINATED (FSI) IMAGE SENSOR WITH A REFLECTOR

(71) Applicant: Taiwan Semiconductor Manufacturing Co., Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Jeng-Shyan Lin, Tainan (TW); Hsun-Ying Huang, Tainan (TW); Tzu-Hsuan Hsu, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/980,225

(22) Filed: Dec. 28, 2015

(65) Prior Publication Data

US 2017/0186796 A1 Jun. 29, 2017

(51) Int. Cl.
*H01L 31/062* (2012.01)
*H01L 27/146* (2006.01)

(52) U.S. Cl.
CPC .... *H01L 27/14629* (2013.01); *H01L 27/1469* (2013.01); *H01L 27/14621* (2013.01); *H01L 27/14634* (2013.01); *H01L 27/14636* (2013.01); *H01L 27/14645* (2013.01); *H01L 27/14685* (2013.01)

(58) Field of Classification Search
CPC ......... H01L 27/14629; H01L 27/14643; H01L 31/02624; H01L 31/02162; H01L 31/02327
USPC ........................................ 257/291, 292, 432
See application file for complete search history.

(56) References Cited

U.S. PATENT DOCUMENTS

| | | | | |
|---|---|---|---|---|
| 6,861,686 B2* | 3/2005 | Lee | ................... | H01L 21/76801 257/291 |
| 8,274,122 B2* | 9/2012 | Shimotsusa | ......... | H01L 27/1462 257/292 |
| 8,848,075 B2* | 9/2014 | Takahashi | ............... | H01L 31/18 348/294 |
| 9,450,012 B2* | 9/2016 | Shimotsusa | ....... | H01L 27/14609 |
| 2010/0203665 A1* | 8/2010 | Park | ................... | H01L 27/14627 438/70 |

* cited by examiner

*Primary Examiner* — Tan N Tran
(74) *Attorney, Agent, or Firm* — Eschweiler & Potashnik, LLC

(57) ABSTRACT

A frontside illuminated (FSI) image sensor with a reflector is provided. A photodetector is buried in a sensor substrate. A support substrate is arranged under and bonded to the sensor substrate. The reflector is arranged under the photodetector, between the sensor and support substrates, and is configured to reflect incident radiation towards the photodetector. A method for manufacturing the FSI image sensor and the reflector is also provided.

20 Claims, 15 Drawing Sheets

FRONTSIDE ILLUMINATED (FSI) IMAGE SENSOR WITH A REFLECTOR

BACKGROUND

Many modern day electronic devices comprise image sensors. Some types of image sensors include frontside illuminated (FSI) image sensors and backside illuminated (BSI) image sensors. A FSI image sensor comprises an array of pixel sensors covered by an interconnect structure, and configured to receive incident radiation (e.g., light) through the interconnect structure. A BSI image sensor comprises an array of pixel sensors overlying an interconnect structure, and configured to receive incident radiation on an opposite side as the interconnect structure. Compared to BSI image sensors, FSI image sensors are more mature. As such, FSI image sensors offer better performance per unit cost and are more common.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
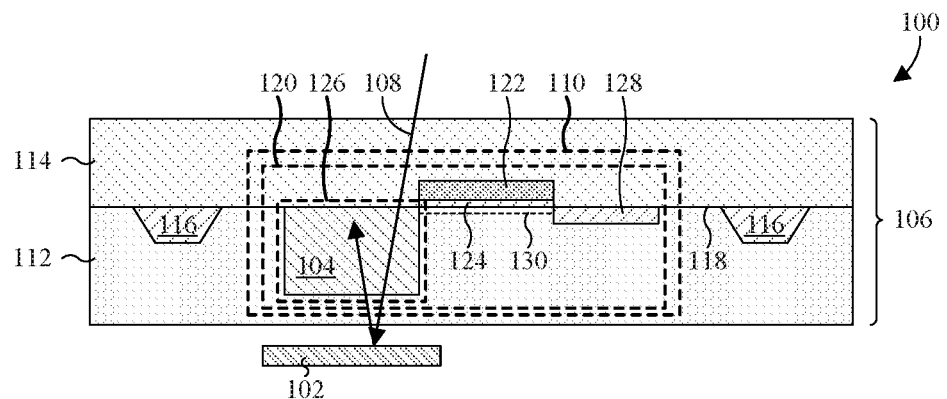
FIG. 1 illustrates a cross-sectional view of some embodiments of a frontside illuminated (FSI) image sensor with a reflector.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some frontside illuminated (FSI) image sensors comprise a sensor device and a support device packaged together. The sensor device is arranged over and bonded to the support device, and comprises an array of pixel sensors arranged in a sensor substrate. The pixel sensors and the support substrate are covered by a sensor interconnect structure, and the sensor interconnect structure is covered by a dielectric layer supporting an array of color filters and an array of microlenses. The support device is arranged under the sensor device, and comprises a plurality of electronic devices arranged in a support substrate. The electronic devices and the support substrate are covered by a support interconnect structure arranged between the support substrate and the sensor substrate.

A challenge with the FSI image sensors is low sensitivity and quantum efficiency. The pixel sensors of the FSI image sensors are configured to receive radiation through the sensor interconnect structure. However, the sensor interconnect structure may comprise conductive features that obstruct or otherwise block the radiation from reaching photodetectors of the pixel sensors. Even more, electronic devices of the pixel sensors may obstruct or otherwise block the radiation from reaching the photodetectors of the pixel sensors. This, in turn, may reduce the amount of radiation reaching the photodetectors of the pixel sensors, which may reduce the sensitivity and the quantum efficiency of the FSI image sensors.

The present application is directed towards a FSI image sensor with a reflector for high sensitivity and quantum efficiency. In some embodiments, the FSI image sensor comprises a sensor device arranged over and bonded to a support substrate. The sensor device comprises a photodetector buried in a sensor substrate. A reflector is arranged under the photodetector, between the sensor device and the support substrate, and is configured to reflect radiation towards the photodetector. By reflecting radiation towards the photodetector, the FSI image sensor advantageously achieves good sensitivity and quantum efficiency.

With reference to FIG. 1, a cross-sectional view 100 of some embodiments of an FSI image sensor with a reflector 102 is provided. As illustrated, the reflector 102 is arranged below a photodetector 104 of a sensor device 106, and is configured to reflect incident radiation 108 towards the photodetector 104, such that the photodetector 104 advantageously achieves good sensitivity and/or quantum efficiency. In some embodiments, the reflector 102 is conductive and comprises one or more conductive features (not individually shown) of a support interconnect structure (not shown) underlying the sensor device 106. The conductive features may, for example, be lines, pads, vias, or a combination of the foregoing. In other embodiments, the reflector 102 is or otherwise comprises a region of a reflective dielectric film (not shown) underlying the sensor device 106. The reflective dielectric film may, for example, be an alternating stack of silicon carbide (SiC) layers and silicon dioxide ($SiO_2$) layers.

The sensor device 106 comprises a pixel sensor 110 arranged in a sensor substrate 112, and further comprises a sensor interconnect structure 114 covering the sensor substrate 112 and the pixel sensor 110. The pixel sensor 110 is laterally surrounded by an isolation region 116 protruding into an upper surface 118 of the sensor substrate 112. The pixel sensor 110 comprises the photodetector 104 buried in the sensor substrate 112 over the reflector 102, and further comprises a transfer transistor 120 arranged on the sensor substrate 112. In some embodiments, the photodetector 104 is arranged directly over the reflector 102. A transfer gate 122 of the transfer transistor 120 is arranged over the sensor substrate 112, and isolated from the sensor substrate 112 by a transfer gate dielectric layer 124. Further, source/drain regions 126, 128 of the transfer transistor 120 are laterally spaced along the upper surface 118 of the sensor substrate 112 to define a transfer channel region 130 under the transfer gate 122. In some embodiments, the photodetector 104 defines one of the source/drain regions 126, 128.

Figure 2A:
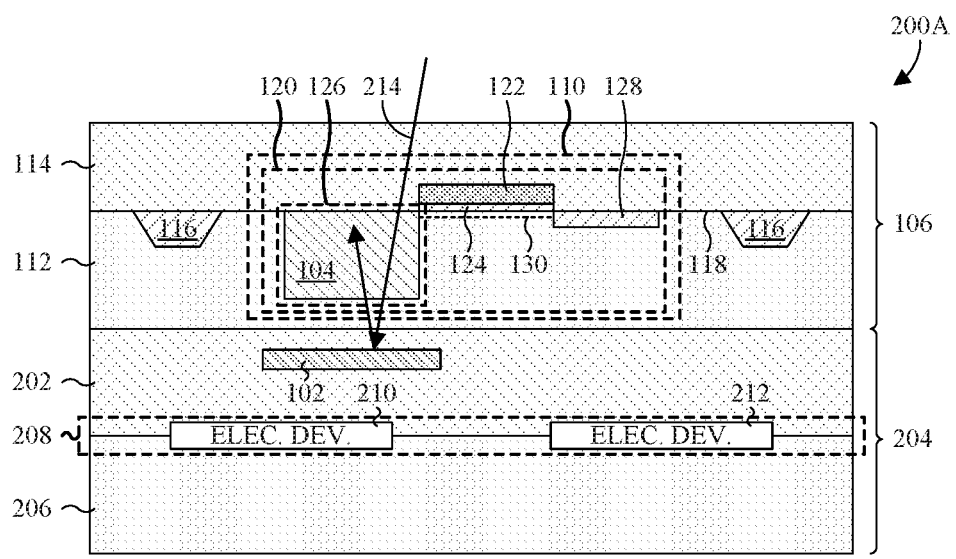
FIGS. 2A and 2B illustrate cross-sectional views of more detailed embodiments of the FSI image sensor of FIG. 1.

With reference to FIG. 2A, a cross-sectional view 200A of some more detailed embodiments of the FSI image sensor of FIG. 1 is provided. As illustrated, a reflector 102 is arranged in a support interconnect structure 202 of a support device 204. The reflector 102 is conductive and comprises one or more conductive features (not individually shown) of the support interconnect structure 202. In some embodiments, the conductive features correspond to lines, pads, vias, or a combination of the foregoing. Further, in some embodiments, the conductive features are distributed amongst one or more heights above a support substrate 206 of the support device 204. The support substrate 206 is arranged under the support interconnect structure 202, and a device region 208 of the support device 204 is arranged between the support interconnect structure 202 and the support substrate 206. The device region 208 comprises one or more electronic devices 210, 212, such as, for example, transistors.

A sensor device 106 is arranged over and bonded to the support device 204. The sensor device 106 comprises a pixel sensor 110 arranged in a sensor substrate 112 and covered by a sensor interconnect structure 114. The pixel sensor 110 comprises a photodetector 104 buried in the sensor substrate 112 over the reflector 102. In some embodiments, the photodetector 104 is arranged directly over the reflector 102. In operation, the pixel sensor 110 is exposed to radiation 214 through the sensor interconnector structure 114, and the pixel sensor 110 measures the radiation 214 as it impinges on the photodetector 104. Further, the reflector 102 reflects the radiation 214 back towards the pixel sensor 110 upon passing through pixel sensor 110. This advantageously results in good sensitivity and/or quantum efficiency.

Figure 2B:
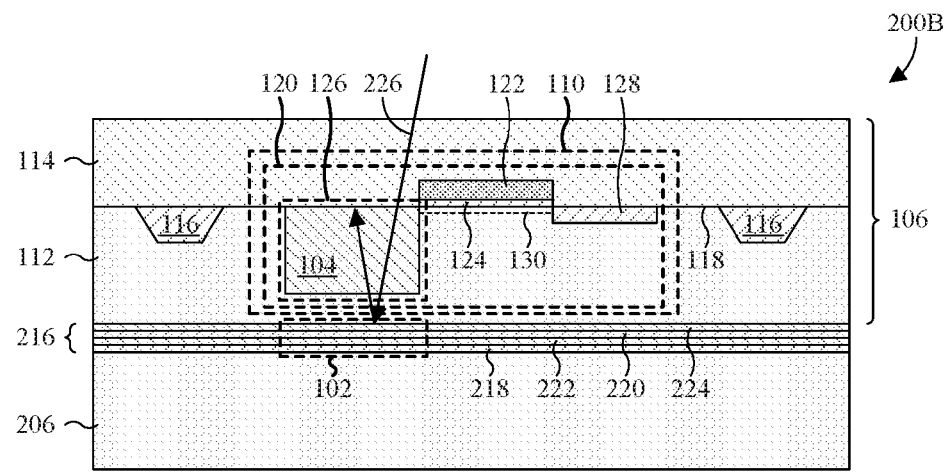

With reference to FIG. 2B, a cross-sectional view 200B of other more detailed embodiments of the FSI image sensor of FIG. 1 is provided. As illustrated, a reflector 102 is arranged between a support substrate 206 and a sensor device 106. The reflector 102 is or otherwise comprises a region of a reflective dielectric film 216 underlying the sensor device 106. The reflective dielectric film 216 may, for example, be an alternating stack of first layers 218, 220 of silicon carbide (SiC) and second layers 222, 224 of silicon dioxide ($SiO_2$). The sensor device 106 comprises a pixel sensor 110 arranged in a sensor substrate 112 and covered by a sensor interconnect structure 114. In operation, the pixel sensor 110 is exposed to radiation 226 through the sensor interconnector structure 114 and the reflector 102 reflects the radiation 214 back towards the pixel sensor 110 after it passes through the pixel sensor 110, such that the pixel sensor 110 advantageously achieves good sensitivity and/or quantum efficiency.

Figure 3A:
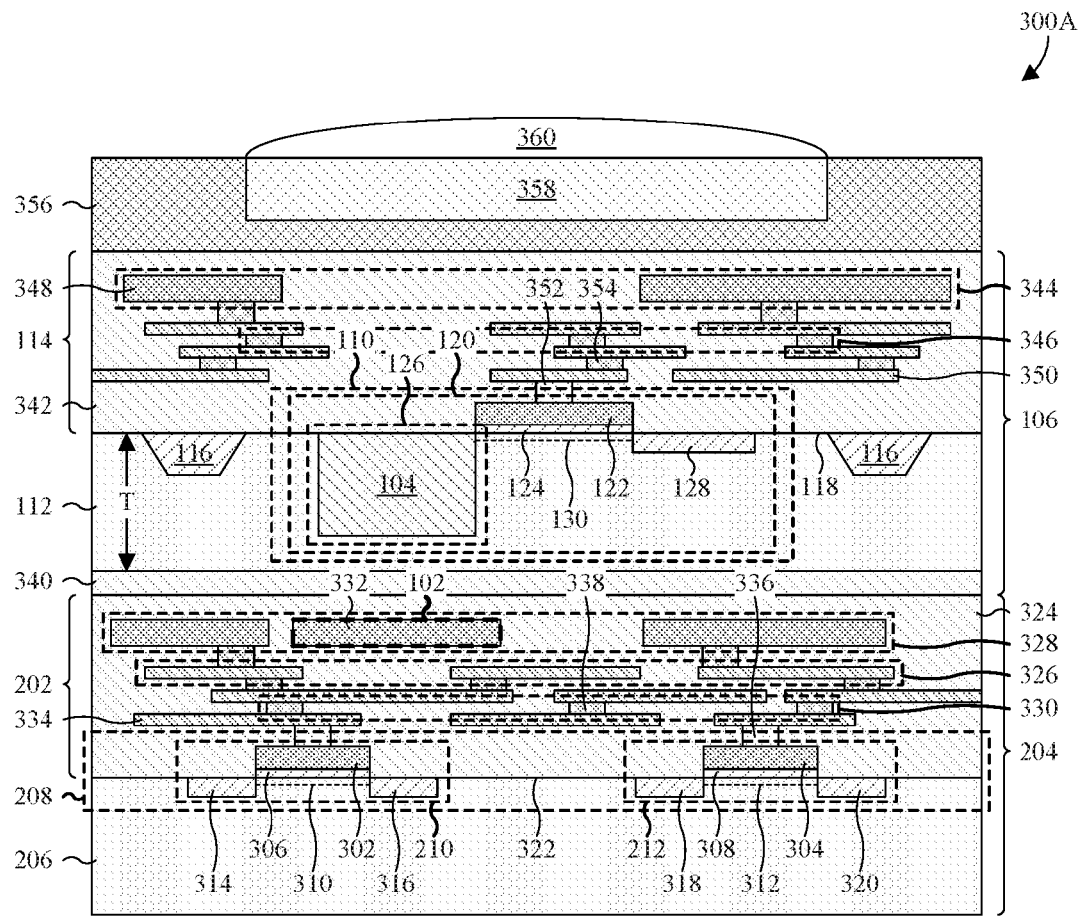
FIGS. 3A and 3B illustrate cross-sectional views of more detailed embodiments of the FSI image sensor of FIG. 2A.

With reference to FIG. 3A, a cross-sectional view 300A of some more detailed embodiments of the FSI image sensor of FIG. 2A is provided. As illustrated, a support device 204 comprises a support substrate 206 and a device region 208 arranged on an upper side of the support substrate 206. The support substrate 206 may be, for example, a bulk semiconductor substrate, such as bulk silicon substrate, or a silicon-on-insulator (SOI) substrate. The device region 208 comprises multiple electronic devices 210, 212 arranged in one or more respective active (or body) regions of the support substrate 206. The electronic devices 210, 212 may be, for example, transistors, memory cells, or a combination of the foregoing.

In some embodiments, at least some of electronic devices 210, 212 comprise respective gates 302, 304 arranged over and isolated from the support substrate 206 by respective gate dielectric layers 306, 308. The gates 302, 304 may be, for example, doped polysilicon, metal, or some other conductive material. The gate dielectric layers 306, 308 may be, for example, an oxide, such as silicon dioxide, a high κ dielectric (i.e., a dielectric with a dielectric constant greater than about 3.9), or some other dielectric. The gates 302, 304 are arranged over respective channel regions 310, 312, and the channel regions 310, 312 selectively conduct depending upon a bias applied to the gates 302, 304. The channel regions 310, 312 are defined between respective source/drain regions 314, 316, 318, 320, and the source/drain regions 314, 316, 318, 320 are arranged in an upper surface 322 of the support substrate 206. The source/drain regions 314, 316, 318, 320 may be, for example, doped regions of the support substrate 206 that have an opposite doping type (e.g., p- or n-type) as respective active regions of the support substrate 206.

A support interconnect structure 202 is arranged over the device region 208 and the support substrate 206 to interconnect the electronic devices 210, 212. The support interconnect structure 202 comprises an inter-layer dielectric (ILD) region 324 accommodating interconnect layers 326, 328 (e.g., metallization layers) and via layers 330. For ease of illustration, only some of the interconnect layers 326, 328 and one of the via layers 330 are labeled. The ILD region 324 comprises multiple ILD layers (not individually shown) and a passivation layer (not shown) covering the ILD layers. The ILD region 324 may be or otherwise include, for example, an oxide, a low κ dielectric (i.e., a dielectric with a dielectric constant less than about 3.9), some other dielectric material, or a combination of the foregoing.

The interconnect layers 326, 328 and the via layers 330 are stacked upon one another within the ILD region 324. In some embodiments, the stack alternates between the interconnect layers 326, 328 and the via layers 330. The interconnect layers 326, 328 comprise first conductive features 332, 334, such as, for example, lines and/or pads, and the via layers 330 comprise second conductive features 336, 338, such as, for example, contact vias and interconnect vias. For ease of illustration, only some of the first and second conductive features 332, 334, 336, 338 are labeled. The contact vias (e.g., a contact via conductive feature 336) extend between a bottommost interconnect layer (not labeled) and the device region 208, and the interconnect vias (e.g., an interconnect via conductive feature 338) extend between neighboring interconnect layers. For example, some of the interconnect vias may extend between a topmost interconnect layer 328 and an interconnect layer 326 immediately under the topmost interconnect layer 328. The interconnect layers 326, 328 and the via layers 330 may be, for example, a metal, such as copper, titanium, chromium, niobium, lead, palladium, gold, silver, aluminum, tungsten, or some other conductive material.

A reflector 102 is configured to reflect radiation towards an overlying photodetector 104, and is arranged in the support interconnect structure 202. The reflector 102 is conductive and comprises one or more conductive features of the interconnect layers 326, 328 and the via layers 330. For example, the reflector 102 may comprise a topmost conductive feature 332. In some embodiments, the conductive feature(s) of the reflector 102 correspond to lines, pads, vias, or a combination of the foregoing. Further, in some embodiments, the conductive feature(s) of the reflector 102 are distributed amongst one or more of the interconnect layers 326, 328 and/or one or more of the via layers 330. In some embodiments, a material of the reflector 102 (i.e., of the conductive feature(s)) is selected based upon wavelengths of radiation that the photodetector 104 is configured to absorb, since some materials are more reflective for certain wavelengths than other materials. For example, the reflectivity of aluminum, silver, gold, and copper is respectively about 86.7%, 99.2%, 98.0%, and 98.1% at about 800 nanometer radiation; is respectively about 90.5%, 98.8%, 95.5%, and 96.6% at about 650 nanometer radiation; and is respectively about 91.8%, 97.9%, 47.7, and 60.0% at about 500 nanometer radiation.

A sensor device 106 is arranged over and bonded to the support device 204 at an interface with the support interconnect structure 202. In some embodiments, the sensor device 106 is fusion or hybrid bonded to the support device 204 through a first dielectric layer 340 lining a lower side of the sensor device 106. The first dielectric layer 340 may be, for example, an oxide, such as silicon dioxide, or some other dielectric. The sensor device 106 comprises a sensor substrate 112 supporting a pixel sensor 110 and isolation region 116. The sensor substrate 112 may be, for example, a bulk semiconductor substrate, such as a bulk silicon substrate, or a SOI substrate. In some embodiments, a thickness T of the sensor substrate 112 is selected based upon wavelengths of radiation that the photodetector 104 is configured to absorb. The isolation region 116 protrudes into an upper surface 118 of the sensor substrate 112 and may be, for example, a deep trench isolation (DTI) region, an implant isolation region, a shallow trench isolation (STI) region, or some other type of isolation region.

The pixel sensor 110 is configured to measure incident radiation, and may be, for example, an active pixel sensor with multiple transistors. The pixel sensor 110 comprises the photodetector 104 buried in the sensor substrate 112 over the reflector 102, and further comprises a transfer transistor 120 arranged on the sensor substrate 112. In some embodiments, the photodetector 104 is arranged directly over the reflector 102, such that the reflector 102 reflects incident radiation towards the photodetector 104. As discussed above, this advantageously results in good sensitivity and quantum efficiency for the pixel sensor 110. The photodetector 104 may, for example, be a doped region of opposite doping type as an active region of the sensor substrate 112 that accommodates the pixel sensor 110, thereby defining a PN junction at an interface between the photodetector 104 and the sensor substrate 112. The transfer transistor 120 is configured to transfer charge accumulated in the photodetector 104 for readout.

A transfer gate 122 of the transfer transistor 120 is arranged over the sensor substrate 112, and isolated from the sensor substrate 112 by a transfer gate dielectric layer 124. The transfer gate 122 may be, for example, doped polysilicon, metal, or some other conductive material. The transfer gate dielectric layer 124 may be, for example, an oxide, such as silicon dioxide, a high κ dielectric, or some other dielectric. The transfer gate 122 is arranged over a transfer channel region 130 that selectively conducts depending upon a bias applied to the transfer gate 122. The transfer channel region 130 is defined between source/drain regions 126, 128 that are laterally spaced along the upper surface 118 of the sensor substrate 112. The source/drain regions 126, 128 are doped regions of an opposite doping type as an active region of the sensor substrate 112 that accommodates the pixel sensor 110. In some embodiments, the photodetector 104 defines one of the source/drain regions 126, 128.

A sensor interconnect structure 114 is arranged over the pixel sensor 110 and the sensor substrate 112 to interconnect electronic devices of the pixel sensor 110, such as the transfer transistor 120, and other electronic devices on the sensor substrate 112. The sensor interconnect structure 114 comprises an ILD region 342 accommodating an alternating stack of interconnect and via layers 344, 346. For ease of illustration, only one of the interconnect layer 344 and one of the via layers 346 is labeled. The ILD region 342 may be or otherwise include, for example, an oxide, a low κ dielectric, some other dielectric material, or a combination of the foregoing. The interconnect layers 344 comprise first conductive features 348, 350, such as, for example, lines and/or pads, and the via layers 346 comprise second conductive features 352, 354, such as, for example, contact vias and interconnect vias. For ease of illustration, only some of the first and second conductive features 348, 350, 352, 354 are labeled. The interconnect and via layers 344, 346 may be, for example, a metal, such as copper, gold, silver, aluminum, aluminum copper, tungsten, or some other conductive material.

A second dielectric layer 356 is arranged over the sensor interconnect structure 114 and comprises a well filled with a color filter 358 and covered by a microlens 360. The second dielectric layer 356 may be, for example, a multilayer stack, such as, for example, a nitride layer stacked between a pair of oxide layers. The color filter 358 is configured to selectively transmit an assigned color or wavelengths of radiation to the pixel sensor 110, and the microlens 360 is configured to focus incident radiation onto the color filter 358 and/or the pixel sensor 110. In some embodiments, the color filter 358 is configured to transmit red, green, or blue radiation, while blocking other wavelengths of radiation.

Figure 3B:
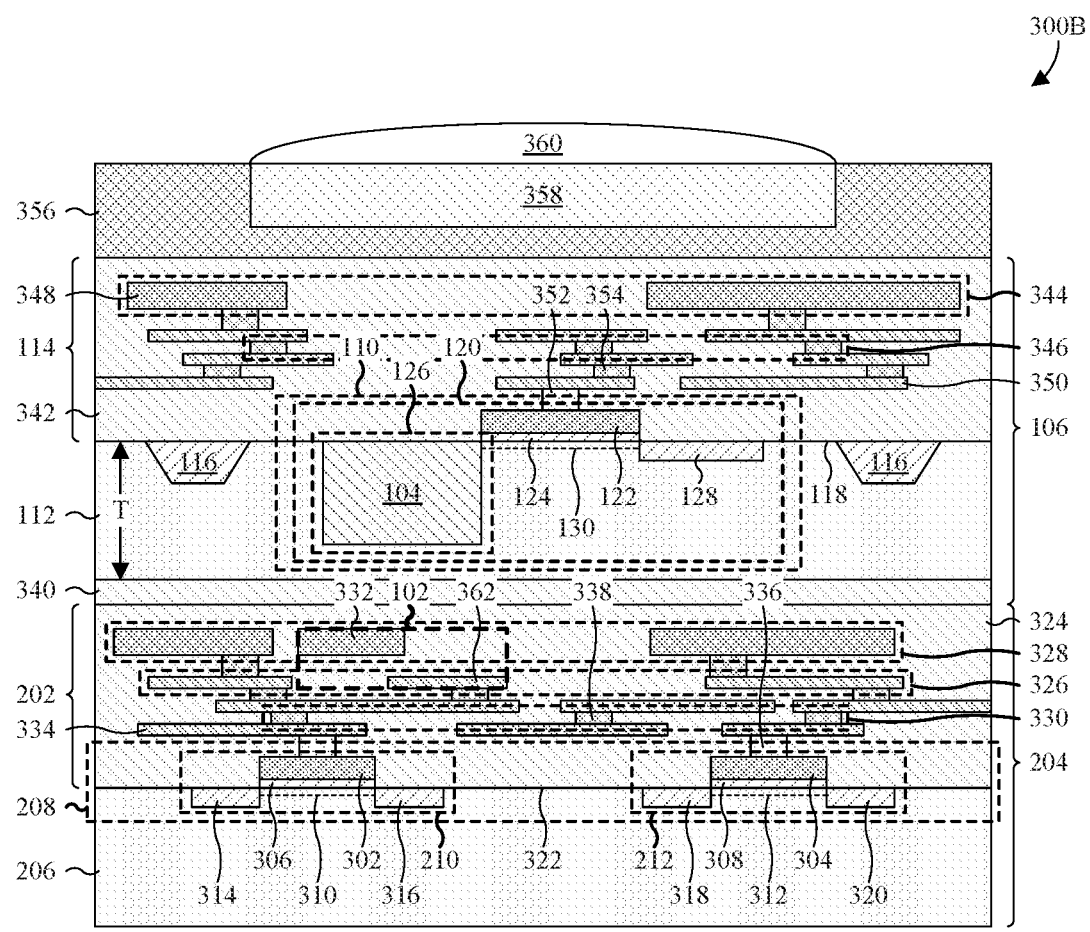

With reference to FIG. 3B, a cross-sectional view 300B of other more detailed embodiments of the FSI image sensor of FIG. 2A is provided. As illustrated, a reflector 102 comprises a pair of conductive features 332, 362, such as lines and/or pads, arranged under the photodetector 104 in different interconnect layers 326, 328. In some embodiments, the conductive features 332, 362 are arranged directly under the photodetector 104. Further, in some embodiments, the conductive features 332, 362 have a combined footprint substantially equal to or greater than a footprint of the photodetector 104, and/or individual footprints that are smaller than a footprint of the photodetector 104. For example, individual footprints of the conductive features 332, 362 may have areas that are fractions of an area of the photodetector footprint.

Figure 4A:
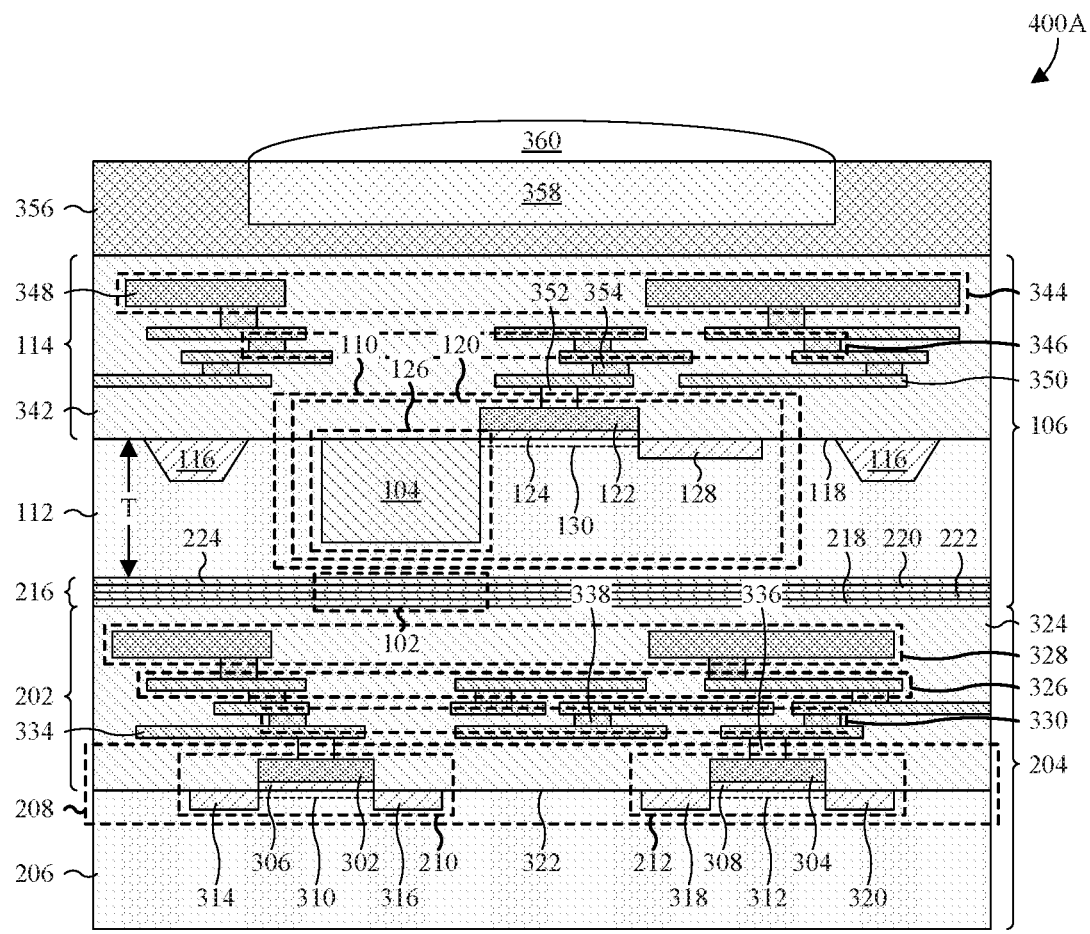
FIGS. 4A and 4B illustrate cross-sectional views of more detailed embodiments of the FSI image sensor of FIG. 2B.

With reference to FIG. 4A, a cross-sectional view 400A of some more detailed embodiments of the FSI image sensor of FIG. 2B is provided. As illustrated, a reflector 102 is or otherwise comprises a region of a reflective dielectric film 216 and underlies a photodetector 104 of a sensor device 106. The reflective dielectric film 216 is arranged on a lower side of the sensor device 106, between the sensor device 106 and a support device 204, and comprises one or more layers 218, 220, 222, 224 stacked upon one another. In some embodiments, the reflective dielectric film 216 comprises an alternating stack of first layers 218, 220 and second layers 222, 224, where the first layers 218, 220 are a different material than the second layers 222, 224. For example, the first layers 218, 220 may be silicon carbide (SiC) and/or the second layers 222, 224 may be silicon dioxide ($SiO_2$). Further, in some embodiments, the layer(s) 218, 220, 222, 224 of the reflective dielectric film 216 have individual thickness of about 900-1100 angstroms, such as about 1000 or 1050 angstroms.

The sensor device 106 and the support device 204 are bonded together through the reflective dielectric film 216. In some embodiments, the sensor device 106 and the support device 204 are bonded together at an interface between the reflective dielectric film 216 and a support interconnect structure 202 of the support device 204. Further, in some embodiments, the sensor device 106 and the support device 204 are bonded together by a fusion or hybrid bond.

Figure 4B:
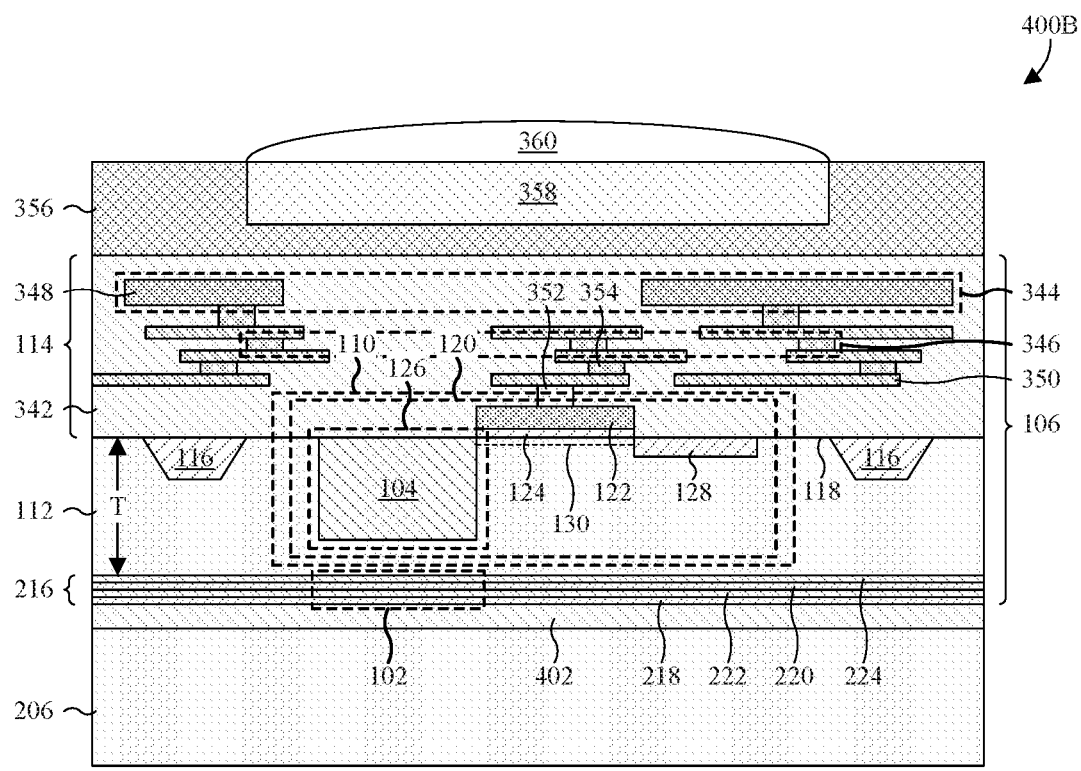

With reference to FIG. 4B, a cross-sectional view 400B of other more detailed embodiments of the FSI image sensor of FIG. 2B is provided. As illustrated, a reflector 102 is or otherwise comprises a region of a reflective dielectric film 216 and underlies a photodetector 104 of a sensor device 106. The reflective dielectric film 216 is arranged on a lower side of the sensor device 106, between the sensor device and a support substrate 206, and comprises one or more layers 218, 220, 222, 224 stacked upon one another.

The sensor device 106 and the support substrate 206 are bonded together through the reflective dielectric film 216. In some embodiments, the sensor device 106 and the support substrate 206 are further bonded together through a dielectric layer 402 between the reflective dielectric film 216 and the support substrate 206. For example, the sensor device 106 and the support substrate 206 may be bonded together at an interface between the reflective dielectric film 216 and the dielectric layer 402. The dielectric layer 402 may be, for example, an oxide, such as silicon dioxide, or some other dielectric. Further, in some embodiments, the sensor device 106 and the support substrate 206 are bonded together by a fusion or hybrid bond.

While the various embodiments of FIGS. 1, 2A, 2B, 3A, 3B, 4A, and 4B are directed towards an FSI image sensors, it is to be appreciated that the various embodiments may be augmented for backside illuminated (BSI) image sensors. For example, the sensor device 106 in FIG. 1, 2A, 2B, 3A, 3B, 4A, or 4B may be flipped vertically.

Figure 5:
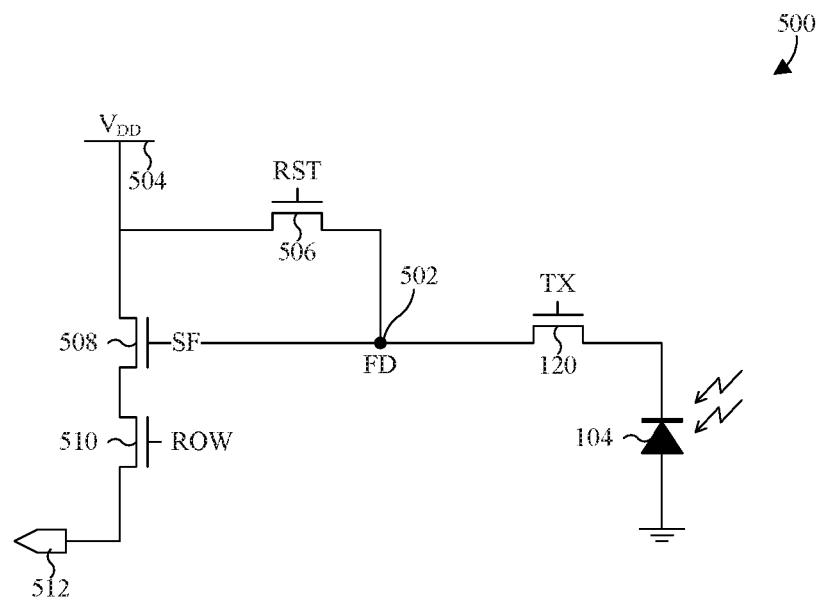
FIG. 5 illustrates a circuit diagram of some embodiments of a pixel sensor in the FSI image sensor of FIG. 1.

With reference to FIG. 5, a circuit diagram 500 of some embodiments of the pixel sensor 110 of FIG. 1 is provided. As illustrated, a charge storage node 502 (e.g., a floating diffusion (FD) node) is selectively coupled to a photodetector 104 by a transfer transistor 120, and is selectively coupled to a power source 504 by a reset transistor 506. The photodetector 104 may be, for example, a photodiode, and/or the power source 504 may be, for example, a direct current (DC) power source. The transfer transistor 120 is configured to selectively transfer charge accumulated in the photodetector 104 to the charge storage node 502, and the reset transistor 506 is configured to selectively clear charge stored at the charge storage node 502. The charge storage node 502 gates a source follower transistor 508 to selectively couple the power source 504 to a row select transistor 510, and the row select transistor 510 selectively couples the source follower transistor 508 to an output 512. The source follow transistor 508 is configured to non-destructively read and amplify charge stored in the charge storage node 502, and the row select transistor 510 is configured to select the pixel sensor 110 for readout.

While the pixel sensor 110 of FIG. 1 is described as a five transistor (5T) active pixel sensor (i.e., an active pixel sensor with 5 transistors) within FIG. 5, it is to be appreciated that other embodiments of the pixel sensor 110 may include more or less transistors. For example, other embodiments of the pixel sensor 110 of FIG. 1 may include 2, 3, or 6 transistors.

Figure 6:
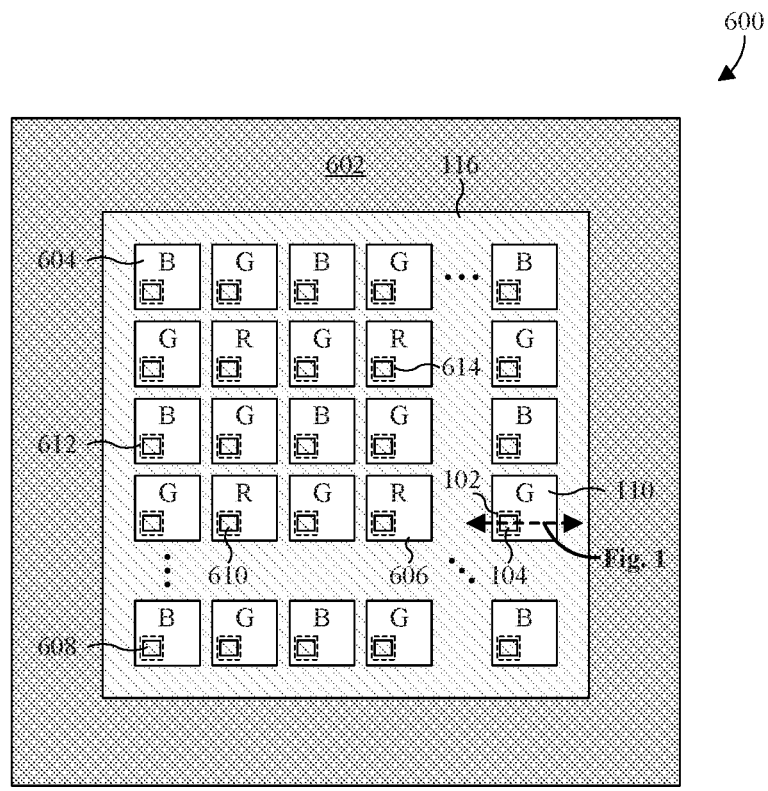
FIG. 6 illustrates a top view of some embodiments of the FSI image sensor of FIG. 1.

With reference to FIG. 6, a top view 600 of some embodiments of the FSI image sensor of FIG. 1 is provided. As illustrated, a logic region 602 of the FSI image sensor laterally surrounds an isolation region 116 within which an array of pixel sensors 110, 604, 606 are arranged. For ease of illustration, only some of the pixel sensors 110, 604, 606 are labeled. The logic region 602 comprises, for example, logic and/or memory devices (not shown) configured to read and/or store data generated by the pixel sensors 110, 604, 606 in response to incident radiation. The isolation region 116 is configured to isolate the pixel sensors 110, 604, 606 and is, for example, a STI, implant isolation, or DTI region.

The pixel sensors 110, 604, 606 are assigned respective wavelengths of radiation. In some embodiments, the pixel sensors 110, 604, 606 are alternatingly assigned red wavelengths of radiation (e.g., about 620 to about 750 nanometers), green wavelengths of radiation (e.g., about 495 to about 570 nanometers), and blue wavelengths of radiation (e.g., about 450 to about 495 nanometers). For example, pixel sensors 606 labeled "R" are assigned red wavelengths of radiation, pixel sensors 604 labeled "B" are assigned blue wavelengths of radiation, and pixel sensors 110 labeled "G" are assigned green wavelengths of radiation. Further, in some embodiments, the pixel sensors 110, 604, 606 alternate between red, green, and blue wavelengths of radiation according to a Bayer filter mosaic.

The pixel sensors 110, 604, 606 are individually configured according to the pixel sensor 110 in FIG. 1, 2A, 2B, 3A, 3B, 4A, or 4B, and comprise individual color filters (not shown) configured to filter incident radiation according to the assigned wavelengths of radiation. For example, as seen in FIGS. 3A, 3B, 4A, and 4B, a pixel sensor 110 comprises a color filter 358 arranged thereover. Further, the pixel sensors 110, 604, 606 comprise individual photodetectors 104, 608, 610 and individual reflectors 102, 612, 614 (shown in phantom) underlying the photodetectors 104, 608, 610. For ease of illustration, only some of the photodetectors 104, 608, 610 and some of the reflectors 102, 612, 614 are labeled.

In some embodiments, the reflectors 102, 612, 614 are laterally offset from respective ones of the photodetectors 104, 608, 610 in proportion to a distance from a center of the array and/or in a direction away from the center of the array. The lateral offsets may, for example, be with respect to edges and/or centers of the photodetectors 104, 608, 610 and the reflectors 102, 612, 614. The centers of the photodetectors 104, 608, 610, the reflectors 102, 612, 614, and/or the array may be, for example, centroids of respective footprints of the photodetectors 104, 608, 610, the reflectors 102, 612, 614, and/or the array.

In some embodiments, the reflectors 102, 612, 614 are different materials depending upon the assigned wavelengths of radiation for respective pixel sensors 110, 604, 606. The materials of the reflectors 102, 612, 614 may, for example, be selected to optimize reflectance of the assigned wavelengths of radiation. For example, reflectors 102 assigned green wavelengths of radiation may be a first material with a high reflectance for the green wavelengths, reflectors 612 assigned blue wavelengths of radiation may be a second material with a high reflectance for the blue wavelengths, and/or reflectors 614 assigned red wavelengths of radiation may be a third material with a high reflectance for the red wavelengths.

With reference to FIGS. 7-9, 10A, 10B, and 11-16, a series of cross-sectional views of some embodiments of a method for manufacturing a FSI image sensor with a reflector is provided. The cross-sectional views are applied to the embodiments of FIG. 3A, but are equally amenable to the embodiments of FIG. 2A or 3B, or other embodiments.

Figure 7:
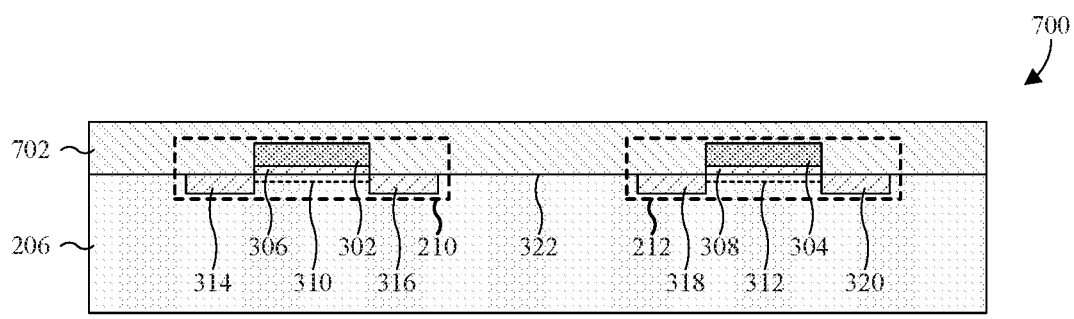
FIGS. 7-9, 10A, 10B, and 11-16 illustrate a series of cross-sectional views of some embodiments of a method for manufacturing a FSI image sensor with a reflector.

As illustrated by the cross-sectional views 700 of FIG. 7, electronic devices 210, 212 are formed on an upper side of a support substrate 206. In some embodiments, at least some of the electronic devices 210, 212 comprise respective gates 302, 304 arranged over and spaced from the support substrate 206 by respective gate dielectric layers 306, 308. Further, in some embodiments, the gates 302, 304 are arranged over respective channel regions 310, 312 defined between respective source/drain regions 314, 316, 318, 320 that are laterally spaced along an upper surface 322 of the support substrate 206.

Also illustrated by the cross-sectional view 700 of FIG. 7, an ILD layer 702 is formed covering the electronic devices 210, 212 and the support substrate 206. In some embodiments, the ILD layer 702 is formed of oxide, such as silicon dioxide, a low κ dielectric, or some other dielectric. Further, in some embodiments, the ILD layer 702 is formed by thermal oxidation or vapor deposition, such as, for example, chemical vapor deposition (CVD) or physical vapor deposition (PVD).

Figure 8:
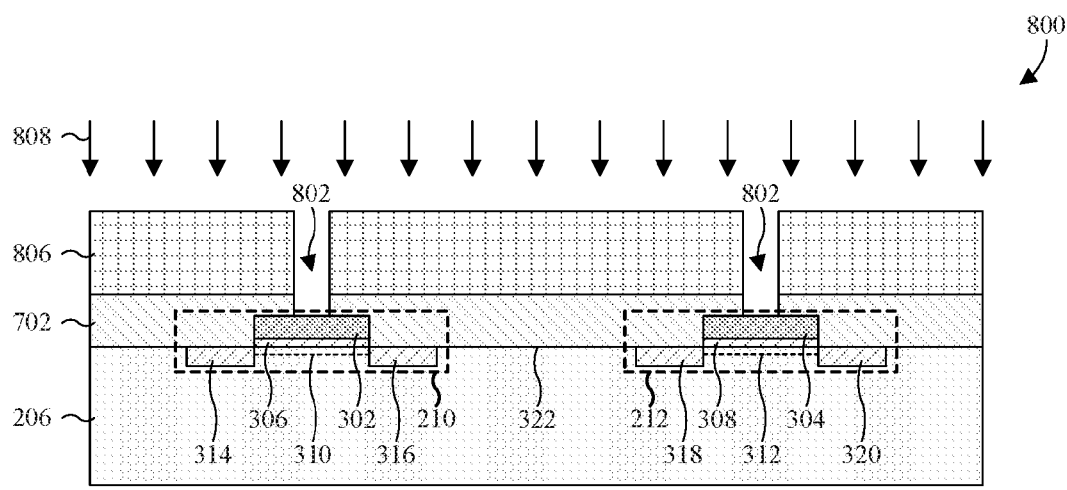

As illustrated by the cross-sectional view 800 of FIG. 8, a first etch is performed into the ILD layer 702 to form via openings 802, 804 (e.g., contact via openings) exposing terminals of the electronic devices 210, 212. In some embodiments, the via openings 802, 804 expose gates 302, 304, source/drain regions 314, 316, 318, 320, or a combination of the foregoing. Further, in some embodiments, the process for performing the first etch comprises depositing and patterning a first photoresist layer 806 over the ILD layer 702; applying one or more etchants 808 to the ILD layer 702 while using the first photoresist layer 806 as a mask; and removing or otherwise stripping the first photoresist layer 806 after applying the etchants 808. The first photoresist layer 806 may be, for example, patterned to mask regions of the ILD layer 702 that laterally surround regions of the ILD layer 702 corresponding to the via openings 802, 804. The etchant(s) 808 may be, for example, wet and/or dry.

Figure 9:
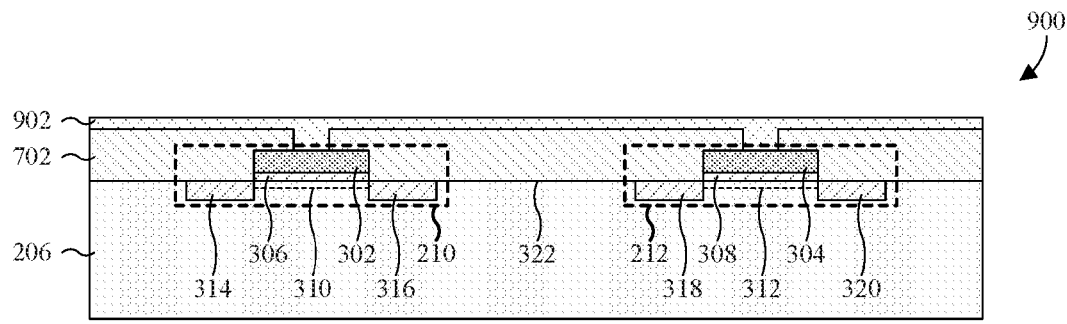

As illustrated by the cross-sectional view 900 of FIG. 9, a first conductive layer 902 is formed covering the ILD layer 702 and filling the via openings 802, 804 (see, e.g., FIG. 8). In some embodiments, the first conductive layer 902 is formed of copper, aluminum, tungsten, titanium, silver, chromium, niobium, lead, palladium, or some other conductive material. Further, in some embodiments, the first conductive layer 902 is formed by vapor deposition, such as, for example, CVD or PVD.

Figure 10A:
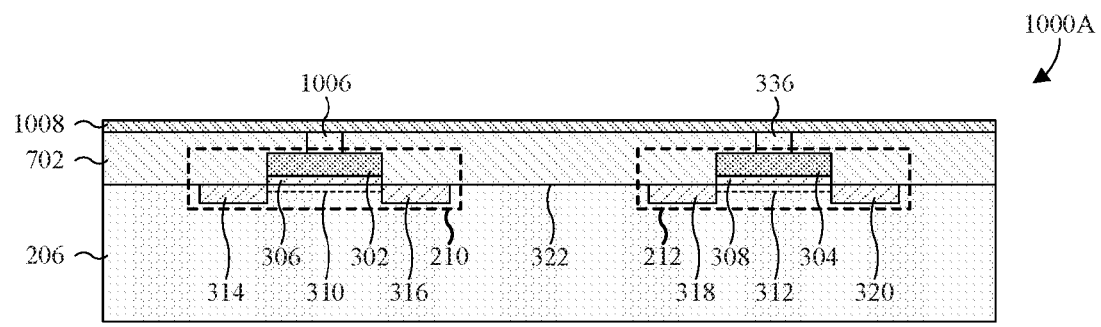
Figure 10B:
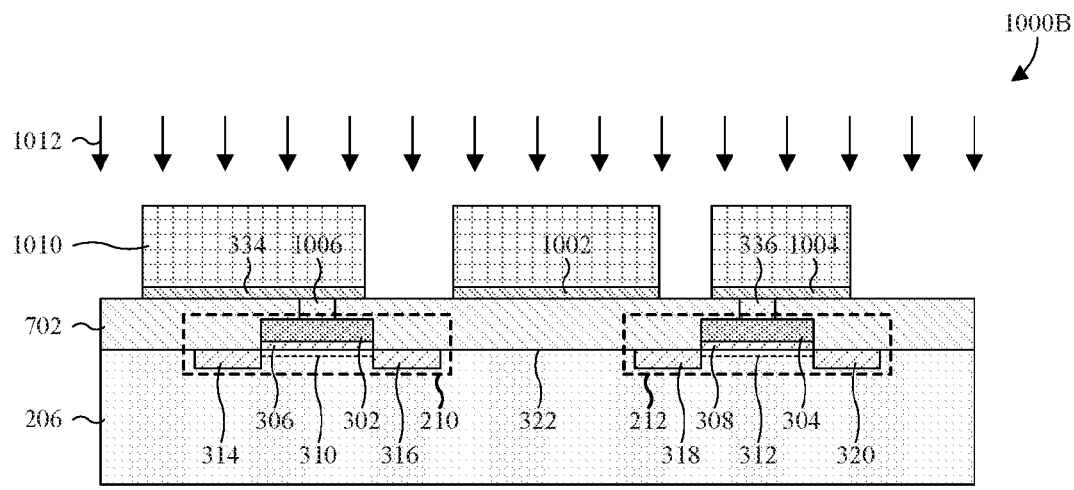

As illustrated by the cross-sectional views 1000A and 1000B of FIGS. 10A and 10B, a single-damascene-like process forms first conductive features 334, 1002, 1004 (see, e.g., FIG. 10B) overlying the ILD layer 702, and further forms second conductive features 336, 1006 (see, e.g., FIG. 10A or 10B) electrically coupling the first conductive features 334, 1002, 1004 to the electronic devices 210, 212. The first conductive features 334, 1002, 1004 may be, for example, lines, pads, or a combination of the foregoing. The second conductive features 336, 1006 may be, for example, contact vias.

As illustrated by the cross-sectional view 1000A of FIG. 10A, a planarization is performed into the first conductive layer 902 (see, e.g., FIG. 9) to form the second conductive features 336, 1006. In some embodiments, the second conductive features 336, 1006 are formed with upper surfaces substantially coplanar with an upper surface of the ILD layer 702. Further, in some embodiments, the process for performing the planarization comprises a chemical mechanical polish (CMP) and/or an etch back into the first conductive layer 902.

Also illustrated by the cross-sectional view 1000A of FIG. 10A, a second conductive layer 1008 is formed covering the ILD layer 702 and the second conductive features 336, 1006. In some embodiments, the second conductive layer 1008 is formed of copper, aluminum, tungsten, titanium, silver, chromium, niobium, lead, palladium, or some other conductive material. Further, in some embodiments, the second conductive layer 1008 is formed by vapor deposition, such as, for example, CVD or PVD.

As illustrated by the cross-sectional view 1000B of FIG. 10B, a second etch is performed into the second conductive layer 1008 (see, e.g., FIG. 10A) to form the first conductive features 334, 1002, 1004 over the ILD layer 702. In some embodiments, the process for performing the second etch comprises depositing and patterning a second photoresist layer 1010 over the second conductive layer 1008; applying one or more etchants 1012 to the second conductive layer 1008 while using the second photoresist layer 1010 as a mask; and removing or otherwise stripping the second photoresist layer 1008 after applying the etchants 1012. The second photoresist layer 1010 may be, for example, patterned to mask regions of the second conductive layer 1008 corresponding to the second conductive features 334, 1002, 1004.

Figure 11:
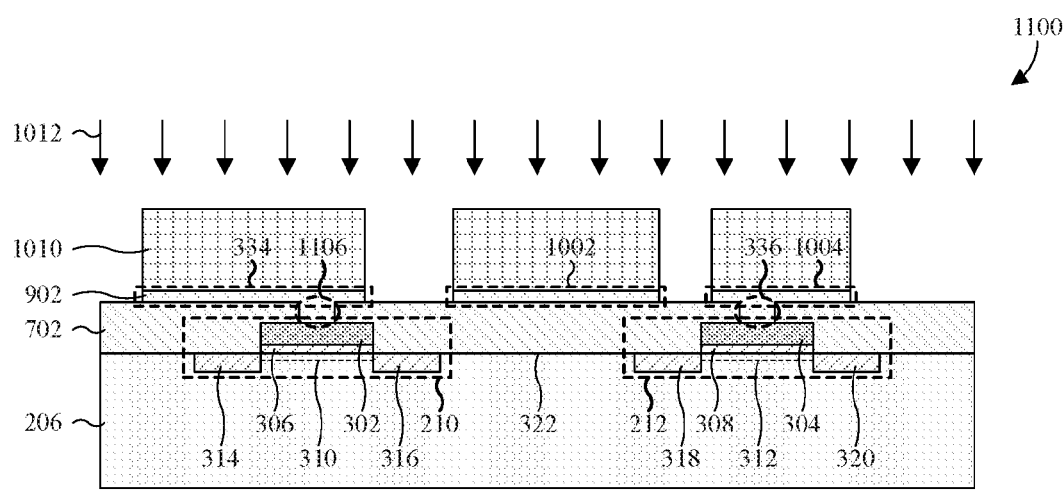

As illustrated by the cross-sectional view 1100 of FIG. 11, a dual-damascene-like process may alternatively be employed to form the first and second conductive features 334, 336, 1002-1006. A second etch is performed into the first conductive layer 902 (see, e.g., FIG. 9) to form the first conductive features 334, 1002, 1004 over the ILD layer 702 and the second conductive features 336, 1006 under the first conductive features 334, 1002, 1004. In some embodiments, the process for performing the second etch comprises depositing and patterning a second photoresist layer 1010 over the first conductive layer 902; applying one or more etchants 1012 to the first conductive layer 902 while using the second photoresist layer 1010 as a mask; and removing the second photoresist layer 1008 after applying the etchants 1012. The second photoresist layer 1010 may be, for example, patterned to mask regions of the first conductive layer 902 corresponding to the first conductive features 334, 1002, 1004.

Figure 12:
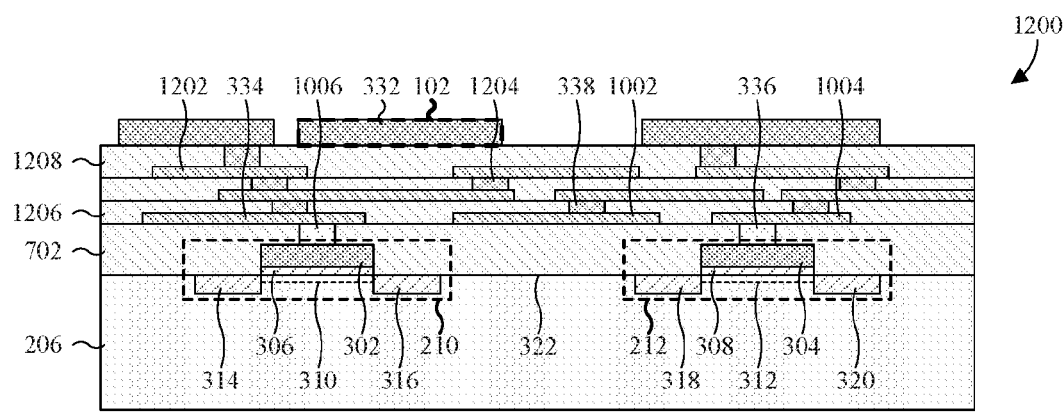

As illustrated by the cross-sectional view 1200 of FIG. 12, the processes of FIGS. 7-11, except for forming the electronic devices 210, 212, are performed repeatedly to form additional conductive features 332, 338, 1202, 1204 and additional ILD layers 1206, 1208. For ease of illustration, only some of the additional conductive features 332, 338, 1202, 1204 and some of the additional ILD layers 1206, 1208 are labeled. Further, the additional conductive features 332, 338, 1202, 1204 are illustrated as being formed by a single-damascene-like process. However, at least some of the additional conductive features 332, 338, 1202, 1204 may alternatively be formed by a dual-damascene-like process.

Also illustrated by the cross-sectional view 1200 of FIG. 12, a reflector 102 is formed in the conductive features 332-338, 1002-1006, 1202, 1204. The reflector 102 is configured to reflect incident radiation and comprises one or more of the conductive features 332-338, 1002-1006, 1202, 1204. The reflector 102 may be, for example, restricted to a single layer of conductive features (i.e., conductive features at a common height above the support substrate 206) or distributed amongst multiple layers of conductive features. Further, the reflector 102 may, for example, be formed of a material with a high reflectivity for wavelengths of radiation that the reflector 102 is intended to reflect.

Figure 13:
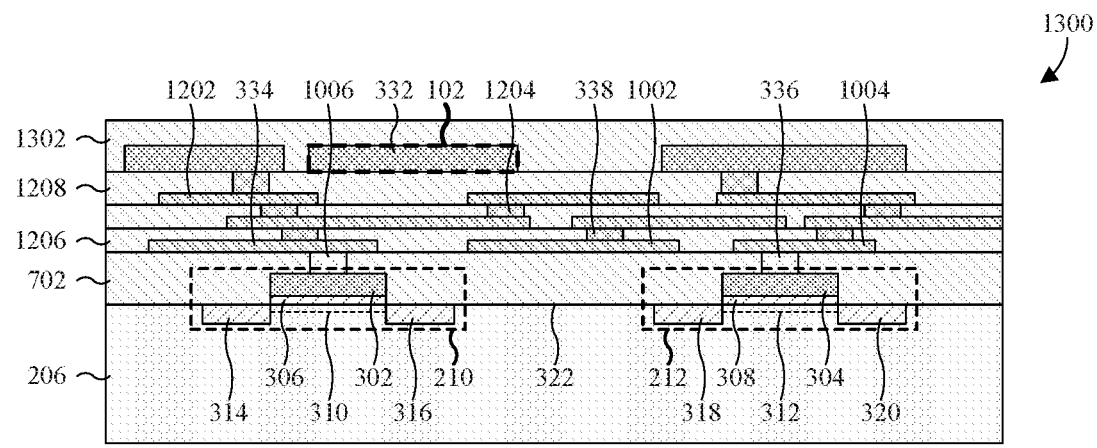

As illustrated by the cross-sectional view 1300 of FIG. 13, a passivation layer 1302 is formed covering the additional conductive features 332, 338, 1202, 1204 and the additional ILD layers 1206, 1208. In some embodiments, the passivation layer 1302 is formed of oxide, such as silicon dioxide, a low κ dielectric, or some other dielectric. Further, in some embodiments, the passivation layer 1302 is formed by thermal oxidation or vapor deposition, such as, for example, CVD or PVD.

Figure 14:
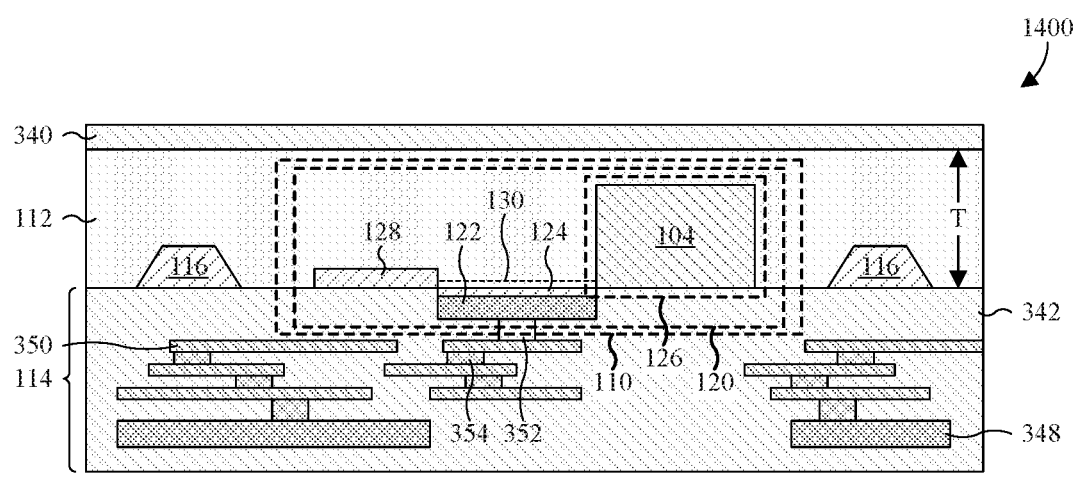

As illustrated by the cross-sectional view 1400 of FIG. 14, a sensor substrate 112 is thinned to a thickness T that is optimal for wavelengths of radiation that a photodetector 104 in the sensor substrate 112 is intended to absorb. In some embodiments, the sensor substrate 112 is thinned by a CMP and/or an etch back.

A pixel sensor 110 and a sensor interconnect structure 114 underlie the sensor substrate 112. The pixel sensor 110 is laterally surrounded by an isolation region 116 protruding into the sensor substrate 112. The pixel sensor 110 comprises the photodetector 104, as well as a transfer transistor 120 arranged on the sensor substrate 112. A transfer gate 122 of the transfer transistor 120 is arranged on the sensor substrate 112, and isolated from the sensor substrate 112 by a transfer gate dielectric layer 124. Further, source/drain regions 126, 128 of the transfer transistor 120 are laterally spaced along the sensor substrate 112 to define a transfer channel region 130. The sensor interconnect structure 114 comprises an ILD region 342 with a stack of conductive features 348-354.

Also illustrated by the cross-sectional view 1400 of FIG. 14, a dielectric layer 340 is formed on the sensor substrate 112, opposite the pixel sensor 110 and the sensor interconnect structure 114. In some embodiments, the dielectric layer 340 is formed of oxide, such as silicon dioxide, or some other dielectric. Further, in some embodiments, the dielectric layer 340 is formed by thermal oxidation, vapor deposition, such as, for example, CVD or PVD, or atomic layer deposition (ALD).

Figure 15:
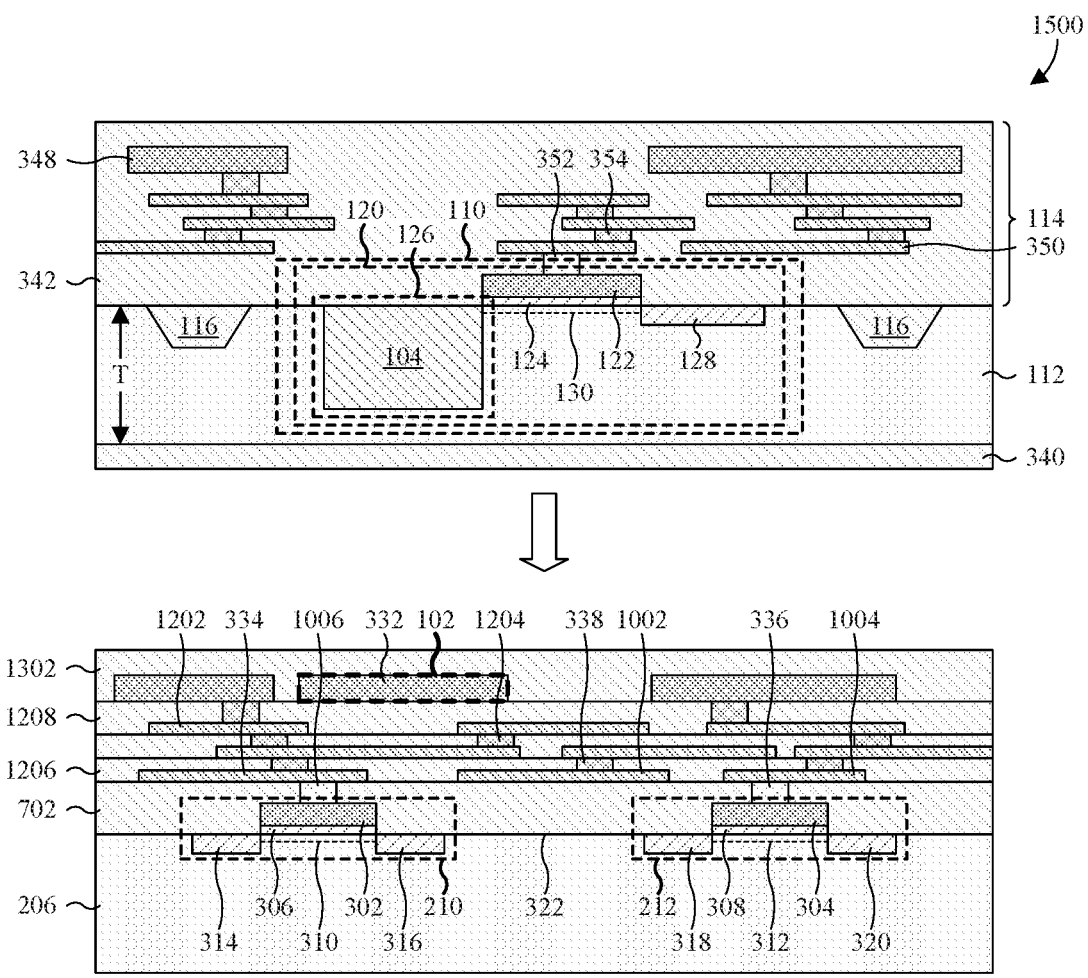

As illustrated by the cross-sectional view 1500 of FIG. 15, the support substrate 206 is bonded to the sensor substrate 112 with the photodetector 104 overlying the reflector 102. In some embodiments, the support and sensor substrates 112, 206 are bonded at an interface between the dielectric layer 340 and the passivation layer 1302 by a hybrid or fusion bond. Further, in some embodiments, the support and sensor substrates 112, 206 are bonded with the photodetector 104 directly overlying the reflector 102.

Figure 16:
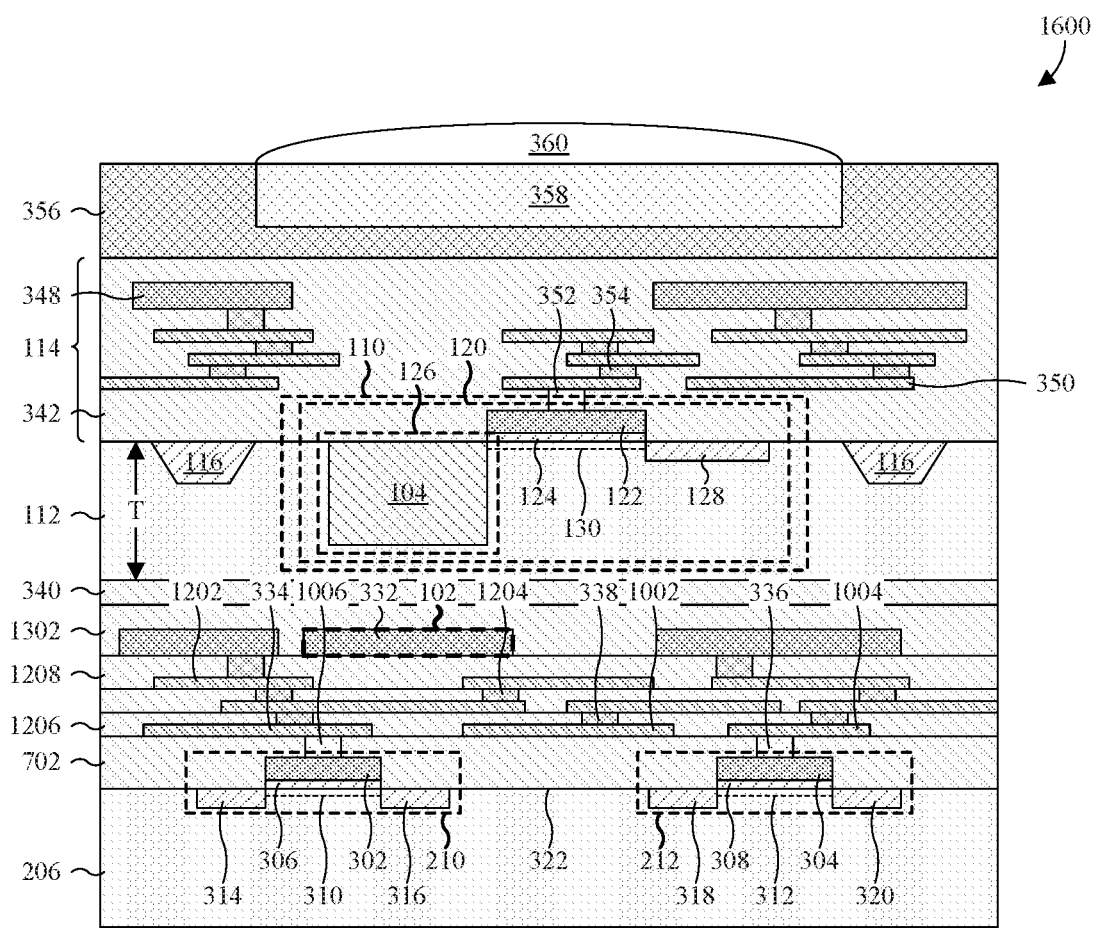

As illustrated by the cross-sectional view 1600 of FIG. 16, an additional dielectric layer 356 is formed on the sensor interconnect structure 114, opposite the sensor substrate 112. Further, a color filter 358 and a microlens 360 are formed over the pixel sensor 110. The color filter 358 is formed buried in the additional dielectric layer 356 and the microlens 360 is formed covering the color filter 358.

Figure 17:
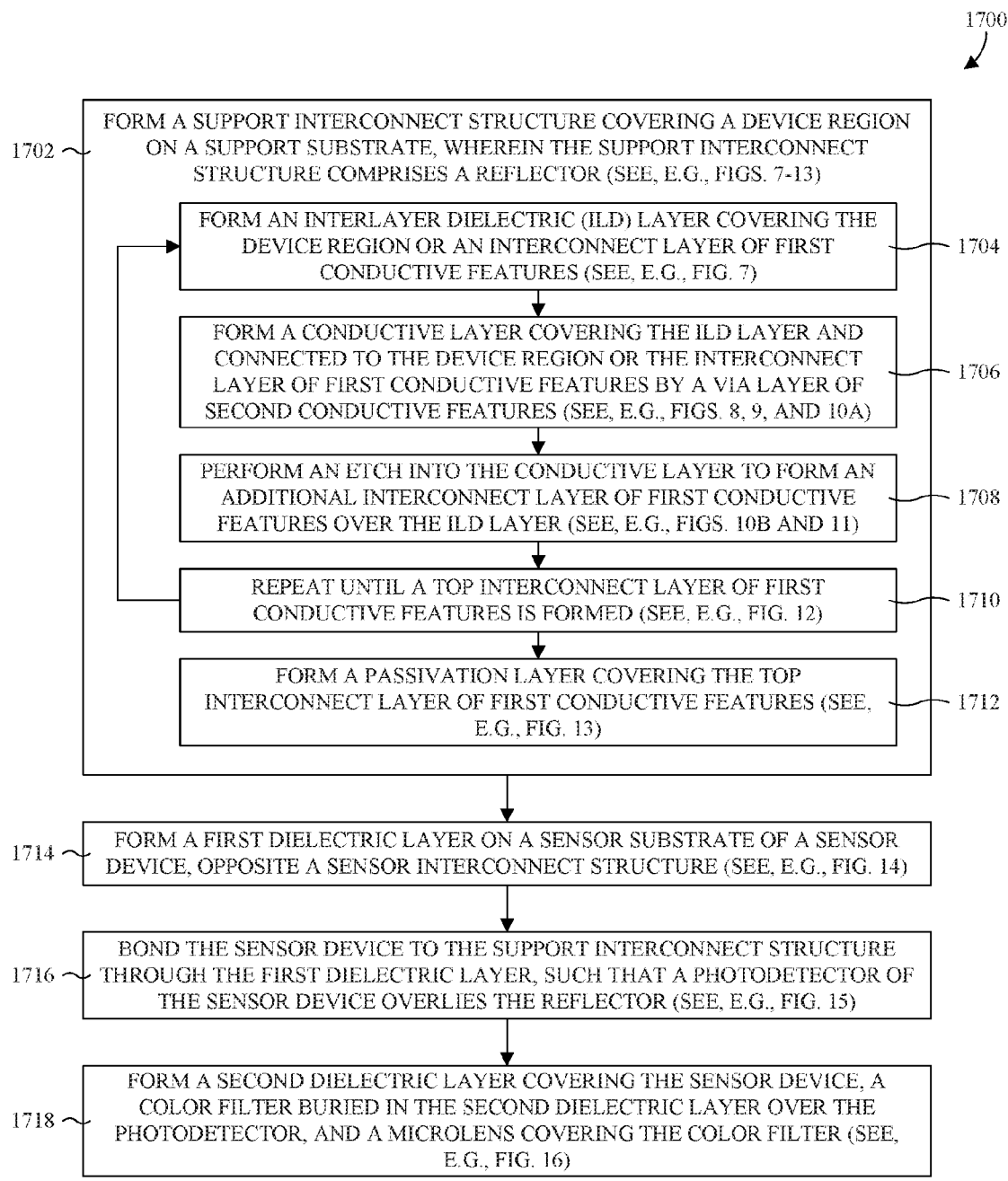
FIG. 17 illustrates a flowchart of some embodiments of the method of FIGS. 7-9, 10A, 10B, and 11-16.

With reference to FIG. 17, a flowchart 1700 of some embodiments of a method for manufacturing a FSI image sensor with a reflector is provided. The method may, for example, to the series of cross-sectional views illustrated with regard to FIGS. 7-9, 10A, 10B, and 11-16.

At 1702, a support interconnect structure is formed covering a device region on a support substrate. The support interconnect structure is formed with a reflector configured to reflect incident radiation. See, for example, FIGS. 7-13. The reflector comprises one or more conductive features of the support interconnect structure.

To form the support interconnect structure, an ILD layer is formed at 1704 covering the device region or an interconnect layer of first conductive features. See, for example, FIG. 7. A conductive layer is formed at 1706 covering the ILD layer and connected to the device region or the interconnect layer of first conductive features by a via layer of second conductive features. See, for example, FIGS. 8, 9, and 10A. An etch is performed at 1708 into the conductive layer to form an additional interconnect layer of first conductive features over the ILD layer. See, for example, FIGS. 10B and 11. Starting with forming the ILD layer, the foregoing process is repeated at 1710 until a top interconnect layer of first conductive features is formed. See, for example, FIG. 12. A passivation layer is formed at 1712 covering the top interconnect layer of first conductive features. See, for example, FIG. 13.

At 1714, with the support interconnect structure formed, a first dielectric layer is formed on a sensor substrate of a sensor device, opposite a sensor interconnect structure. See, for example, FIG. 14. In alternative embodiments, an adhesive layer is formed in place of the first dielectric layer.

At 1716, the sensor device is bonded to the support interconnect structure through the first dielectric layer, such that a photodetector of the sensor device overlies the reflector. See, for example, FIG. 15.

At 1718, a second dielectric layer is formed covering the sensor device, a color filter is formed buried in the second dielectric layer over the photodetector, and a microlens is formed covering the color filter. See, for example, FIG. 16.

While the method described by the flowchart 1700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 18-21, a series of cross-sectional views of other embodiments of a method for manufacturing a FSI image sensor with a reflector is provided. The cross-sectional views are applied to the embodiments of FIG. 4B, but are equally amenable to the embodiments of FIG. 2B or 4A, or other embodiments.

Figure 18:
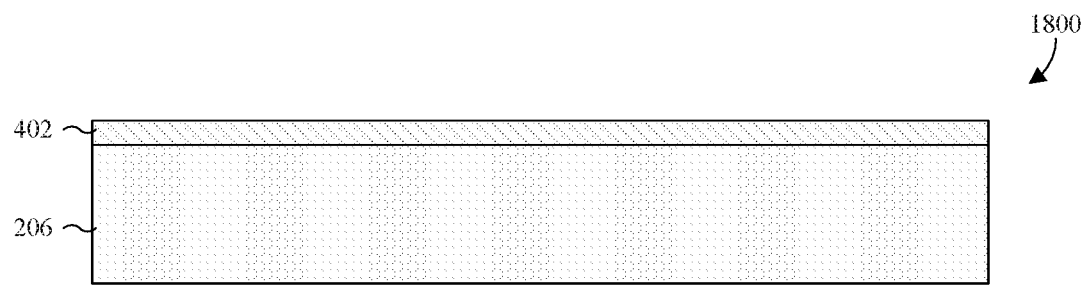
FIGS. 18-21 illustrate a series of cross-sectional views of other embodiments of a method for manufacturing a FSI image sensor with a reflector.

As illustrated by the cross-sectional view 1800 of FIG. 18, a dielectric layer 402 is formed on a support substrate 206. In some embodiments, the dielectric layer 402 is formed of oxide, such as silicon dioxide, or some other dielectric. Further, in some embodiments, the dielectric layer 402 is formed by thermal oxidation, vapor deposition, such as, for example, CVD or PVD, or ALD.

Figure 19:
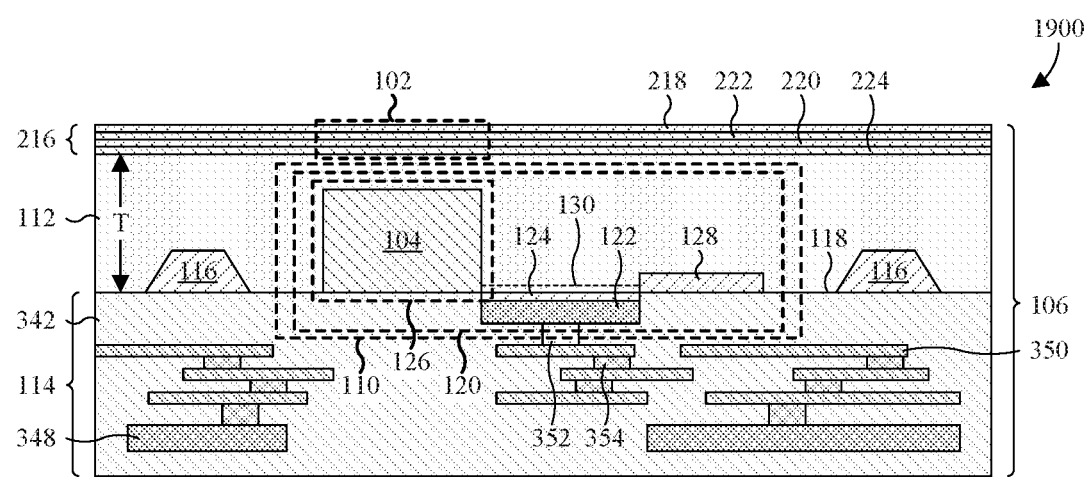

As illustrated by the cross-sectional view 1900 of FIG. 19, a sensor substrate 112 is thinned to a thickness T that is optimal for wavelengths of radiation that a photodetector 104 in the sensor substrate 112 is intended to absorb. In some embodiments, the sensor substrate 112 is thinned by a CMP and/or an etch back.

A pixel sensor 110 and a sensor interconnect structure 114 underlie the sensor substrate 112. The pixel sensor 110 is laterally surrounded by an isolation region 116 protruding into the sensor substrate 112. The pixel sensor 110 comprises the photodetector 104, as well as a transfer transistor 120 arranged on the sensor substrate 112. A transfer gate 122 of the transfer transistor 120 is arranged on the sensor substrate 112, and isolated from the sensor substrate 112 by a transfer gate dielectric layer 124. Further, source/drain regions 126, 128 of the transfer transistor 120 are laterally spaced along the sensor substrate 112 to define a transfer channel region 130. The sensor interconnect structure 114 comprises an ILD region 342 with a stack of conductive features 348-354.

Also illustrated by the cross-sectional view 1900 of FIG. 19, a reflective dielectric film 216 is formed on the sensor substrate 112, opposite the sensor interconnect structure 114. The reflective dielectric film 216 comprises one or more layers 218, 220, 222, 224 stacked upon one another, as well as a region covering the photodetector 104 and defining a reflector 102. In some embodiments, the layer(s) 218, 220, 222, 224 are formed with individual thicknesses between about 900-1100 angstroms, and/or are individually formed by thermal oxidation, vapor deposition, or ALD. Further, in some embodiments, the process for forming the reflective dielectric film 216 comprises alternatingly forming first layers 218, 218 of a first material and second layers 222, 224 of a second material different than the first material. The first and second materials may be, for example, respectively silicon carbide and silicon dioxide.

Figure 20:
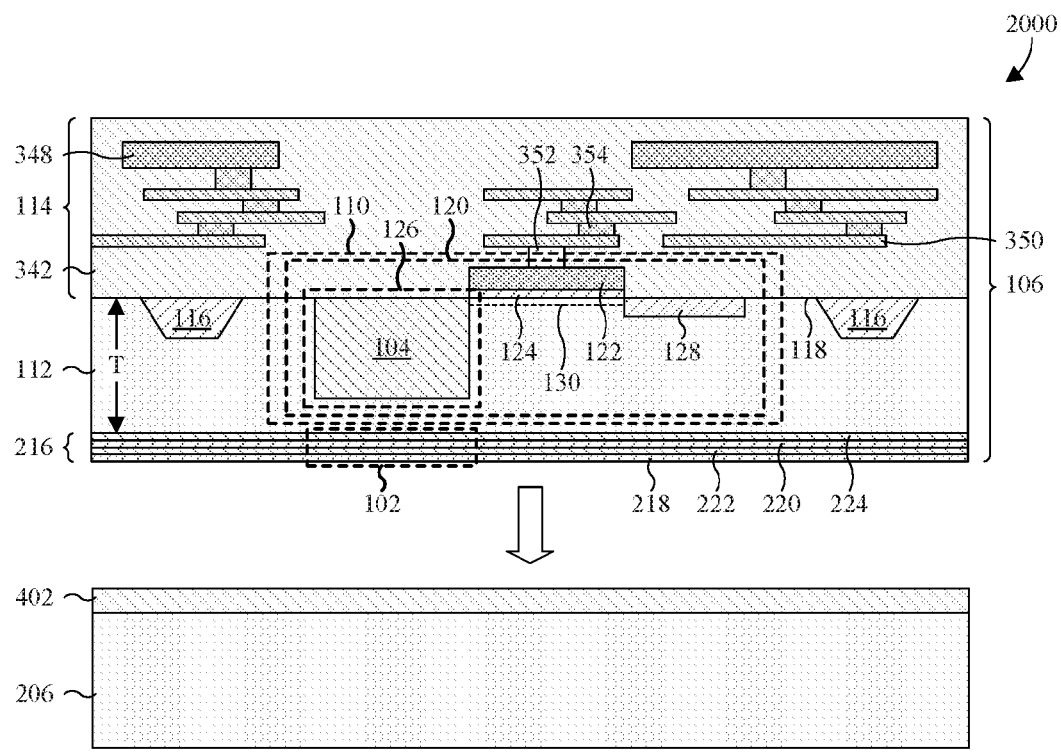

As illustrated by the cross-sectional view 2000 of FIG. 20, the support substrate 206 and the sensor device 106 are bonded together with the photodetector 104 overlying the reflector 102. For example, the support substrate 206 and the sensor device 106 may be bonded together with the photodetector 104 directly over the reflector 102. Further, the support substrate 206 and the sensor device 106 are bonded together through the dielectric layer 402 and the reflective dielectric film 216. In some embodiments, the support substrate 206 and the sensor device 106 are bonded at an interface between the dielectric layer 402 and the reflective dielectric film 216 by a hybrid or fusion bond.

Figure 21:
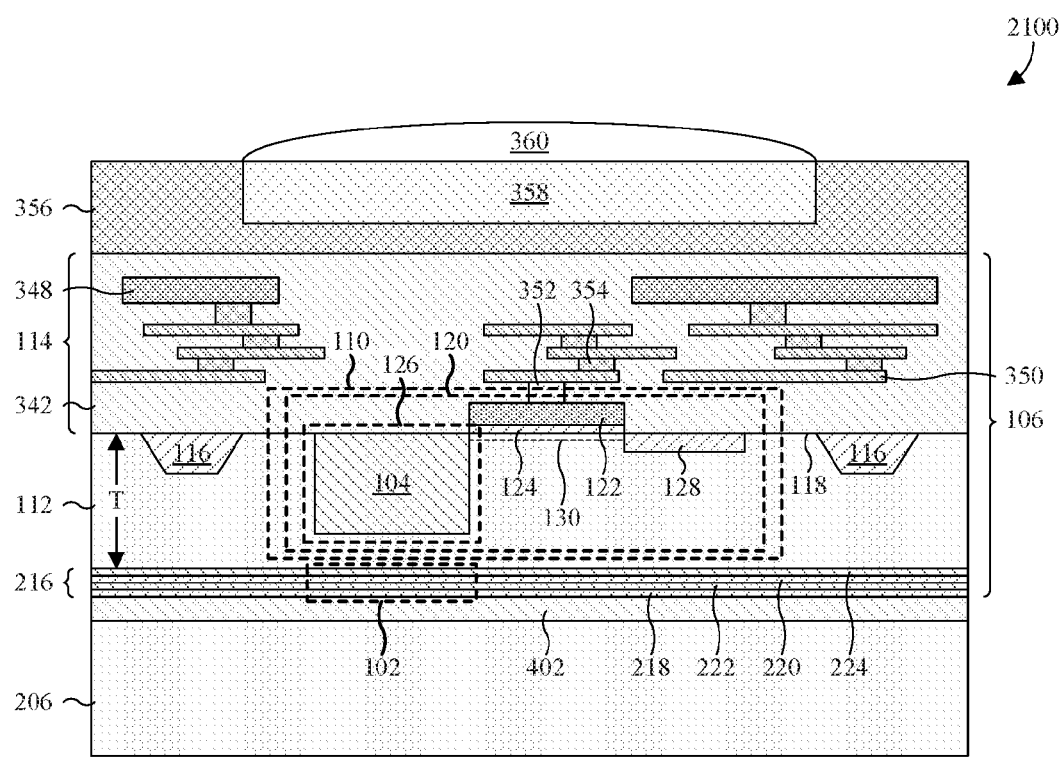

As illustrated by the cross-sectional view 2100 of FIG. 21, an additional dielectric layer 356 is formed on the sensor interconnect structure 114, opposite the sensor substrate 112. Further, a color filter 358 and a microlens 360 are formed over the pixel sensor 110. The color filter 358 is formed buried in the additional dielectric layer 356 and the microlens 360 is formed covering the color filter 358.

Figure 22:
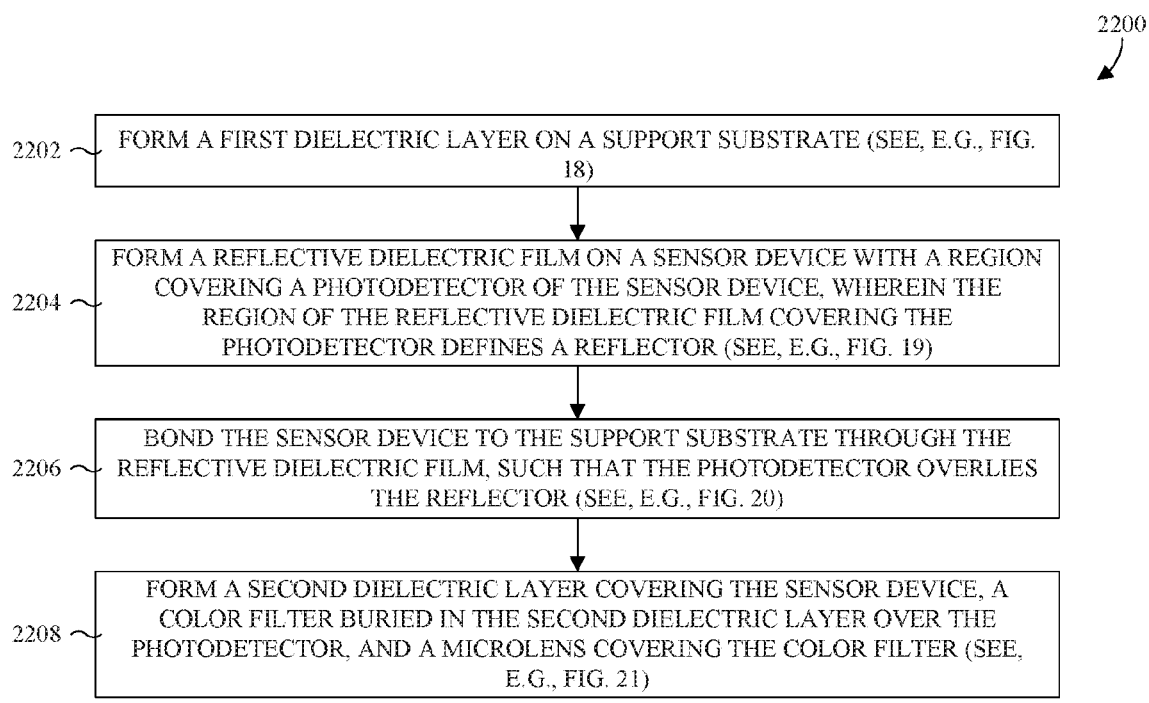
FIG. 22 illustrates a flowchart of some embodiments of the method of FIGS. 18-21.

With reference to FIG. 22, a flowchart 2200 of some embodiments of a method for manufacturing a FSI image sensor with a reflector is provided. The method may, for example, to the series of cross-sectional views illustrated with regard to FIGS. 18-21.

At 2202, a first dielectric layer is formed on a support substrate. See, for example, FIG. 18.

At 2204, a reflective dielectric film is formed on a sensor device with a region covering a photodetector of the sensor device. The region of the reflective dielectric film defines a reflector. See, for example, FIG. 19.

At 2206, the sensor device is bonded to the support substrate through the first dielectric layer and the reflective dielectric film, such that the photodetector overlies the reflector. See, for example, FIG. 20.

At 2208, a second dielectric layer is formed covering the sensor device, a color filter is formed buried in the second dielectric layer over the photodetector, and a microlens is formed covering the color filter. See, for example, FIG. 21.

While the method described by the flowchart 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases. For example, Act 2202 may be omitted, such as where the support substrate is covered by a support interconnect structure. See, for example, FIG. 4A.

Thus, as can be appreciated from above, the present disclosure provides an image sensor. A photodetector is buried in a sensor substrate. A support substrate is arranged under and bonded to the sensor substrate. A reflector is arranged under the photodetector, between the sensor and support substrates, and is configured to reflect incident radiation towards the photodetector.

In other embodiments, the present disclosure provides a method for manufacturing an image sensor. A reflector is formed over a support substrate or on a lower side of a sensor device. The sensor device comprises a photodetector. The sensor device is arranged over the support substrate. The sensor device is bonded to the support substrate with the photodetector overlying the reflector and with the reflector between the support substrate and the sensor device.

In yet other embodiments, the present disclosure provides an image sensor. An array of photodetectors is buried in a sensor substrate. A support device is arranged under and bonded to the sensor substrate. The support device comprises a support substrate and a support interconnect structure arranged between the sensor and support substrates. An array of reflectors is arranged under the array of photodetectors, in the support interconnect structure. The reflectors are configured to reflect incident radiation towards respective ones of the photodetector. The array of reflectors comprises a first reflector of a first material and a second reflector of a second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a sensor device comprising:
   a sensor substrate along a backside of the sensor device;
   a photodetector buried in the sensor substrate;
   a transistor over the sensor substrate, wherein the transistor comprises a gate electrode and the photodetector as a source/drain region; and
   a sensor interconnect structure covering the sensor substrate, the transistor, and the photodetector, wherein the sensor interconnect structure is along a frontside of the sensor device, opposite the backside of the sensor device, wherein the sensor interconnect structure comprises a plurality of via layers and a plurality of interconnect layers alternatingly stacked with the via layers, and wherein a bottom one of the via layers is between and contacts the gate electrode and a bottom one of the interconnect layers;
   a color filter covering the photodetector over the sensor interconnect structure;
   a support device comprising:
   a support substrate along a backside of the support device, and further arranged under and bonded to the sensor substrate;
   a second transistor over and recessed within the support substrate;
   a reflector arranged under the photodetector, between the sensor and support substrates, and configured to reflect incident radiation towards the photodetector; and
   a support interconnect structure covering the second transistor and the support substrate, between the support and sensor substrates, wherein the support interconnect structure is along a frontside of the support device, opposite the backside of the support device, wherein the support interconnect structure comprises a plurality of second via layers and a plurality of second interconnect layers alternatingly stacked with the second via layers, and wherein a bottom one of the second via layers is between and contacts the second transistor and a bottom one of the second interconnect layers;
   wherein the support device is bonded to the sensor device at an interface between the frontside of the support device and the backside of the sensor device.

2. The image sensor according to claim 1, further comprising:
   a reflective dielectric film arranged between the sensor and support substrates, wherein the reflector comprises a region of the reflective dielectric film under the photodetector.

3. The image sensor according to claim 2, wherein the reflective dielectric film comprises alternating layers of different materials.

4. The image sensor according to claim 3, wherein the reflective dielectric film alternates multiple times between silicon carbide and silicon dioxide.

5. The image sensor according to claim 1, wherein the reflector is arranged in the support interconnect structure and comprises a conductive feature of the support interconnect structure.

6. The image sensor according to claim 1, wherein the reflector is arranged in the support interconnect structure and comprises multiple conductive features of the support interconnect structure, and wherein the multiple conductive features are distributed across multiple different heights above the support substrate.

7. The image sensor according to claim 6, wherein individual footprints of the multiple conductive features have smaller areas than a footprint of the photodetector, and wherein a collective footprint of the multiple conductive features has an area about equal to or greater than the footprint of the photodetector.

8. The image sensor according to claim 1, wherein the reflector is arranged directly under the photodetector.

9. The image sensor according to claim 1, further comprising:
   a second photodetector buried in the sensor substrate; and
   a second reflector arranged under the second photodetector, between the sensor and support substrates, and configured to reflect incident radiation towards the second photodetector;
   wherein the reflector and the second reflector are different materials and have different reflectances.

10. The image sensor according to claim 9, further comprising:
    a second color filter covering the second photodetector over the sensor interconnect structure;
    wherein the color filter is configured to pass first radiation wavelengths, but not second radiation wavelengths, wherein the second color filter is configured to pass the second radiation wavelengths, but not the first radiation wavelengths, wherein the reflector is a first conductive material, wherein the second reflector is a second conductive material different than the first conductive material, wherein the reflector has a higher reflectance for the first radiation wavelengths than the second radiation wavelengths, and wherein the second reflector has a higher reflectance for the second radiation wavelengths than the first radiation wavelengths.

11. The image sensor according to claim 1, wherein the reflector is made up of multiple conductive features of the support interconnect structure, including a via of the second via layers, and wherein the via is uncovered by the second interconnect layers.

12. The image sensor according to claim 11, wherein the reflector is made up of only vias of the second via layers.

13. An image sensor comprising:
    an array of photodetectors buried in a sensor substrate;
    an array of color filters over the array of photodetectors, wherein the array of color filters comprises a first color filter and a second color filter, wherein the first color filter is configured to pass first radiation wavelengths, but not second radiation wavelengths, and wherein the second color filter is configured to pass the second radiation wavelengths, but not the first radiation wavelengths;
    a support device arranged under and bonded to the sensor substrate, the support device comprising a support substrate and a support interconnect structure arranged between the sensor and support substrates; and
    an array of reflectors arranged under the array of photodetectors, in the support interconnect structure, wherein the reflectors are configured to reflect incident radiation towards respective ones of the photodetectors, wherein the array of reflectors comprises a first reflector of a first conductive material and a second reflector of a second conductive material different than the first conductive material, wherein the first reflector is directly under the first color filter and has a higher reflectance for the first radiation wavelengths than the second radiation wavelengths, and wherein the second reflector is directly under the second color filter and has a higher reflectance for the second radiation wavelengths than the first radiation wavelengths.

14. The image sensor according to claim 13, wherein the reflectors are arranged directly under the respective ones of the photodetectors.

15. The image sensor according to claim 13, further comprising:
a sensor interconnect structure arranged over the sensor substrate and the array of photodetectors.

16. The image sensor according to claim 13, further comprising:
an array of transistors respectively comprising first source/drain regions, respectively comprising second source/drain regions, and respectively comprising gate electrodes, wherein the gate electrodes are each over the sensor substrate, between a respective one of the first source/drain regions and a respective one of the second source/drain regions, and wherein the first source/drain regions respectively comprise the photodetectors.

17. The image sensor according to claim 13, wherein the first and second reflectors are in a single, conductive layer of the support interconnect structure that is at a top of the support interconnect structure.

18. An image sensor comprising:
a first semiconductor substrate;
a plurality of electronic devices on the first semiconductor substrate;
a first interconnect structure covering the first semiconductor substrate and the electronic devices, wherein the first interconnect structure comprises a first dielectric region and a plurality of first interconnect layers stacked within the first dielectric region;
a second semiconductor substrate over the first interconnect structure;
a plurality of pixel sensors in the second semiconductor substrate, wherein the pixel sensors each comprise a photodetector;
a second interconnect structure covering the second semiconductor substrate and the pixel sensors, wherein the second interconnect structure comprises a second dielectric region and a plurality of second interconnect layers stacked within the second dielectric region;
a reflector between the first semiconductor substrate and the second semiconductor substrate, and configure to reflect incident radiation towards the photodetector; and
a reflective dielectric film between the second semiconductor substrate and the first interconnect structure, wherein the reflective dielectric film comprises an alternating stack of silicon carbide layers and silicon dioxide layers, and wherein the reflector comprises a region of the reflective dielectric film that is directly under the photodetector.

19. The image sensor according to claim 18, wherein each of the second interconnect layers comprises of a plurality of discrete conductive features, and wherein the image sensor further comprises:
a dielectric layer covering the second interconnect structure; and
a color filter buried in the dielectric layer, directly over the pixel sensor.

20. The image sensor according to claim 18, wherein the pixel sensor comprises a transistor on the second semiconductor substrate, wherein the transistor comprises a gate electrode over the second semiconductor substrate, between the second semiconductor substrate and the second interconnect structure, and further comprises a pair of source/drain regions in the second semiconductor substrate and respectively on opposite sides of the gate electrode, and wherein one of the source/drain regions comprises the photodetector.

* * * * *